United States Patent
Lee et al.

(10) Patent No.: US 9,620,683 B2
(45) Date of Patent: Apr. 11, 2017

(54) LIGHT EMITTING DEVICE, LIGHT EMITTING DEVICE ARRAY AND LIGHTING APPARATUS INCLUDING THE SAME

(71) Applicant: LG INNOTEK CO., LTD., Seoul (KR)

(72) Inventors: Keon Hwa Lee, Seoul (KR); Kwang Ki Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/981,438

(22) Filed: Dec. 28, 2015

(65) Prior Publication Data

US 2016/0190396 A1    Jun. 30, 2016

(30) Foreign Application Priority Data

Dec. 26, 2014    (KR) .................. 10-2014-0190407

(51) Int. Cl.
*H01L 33/00*    (2010.01)
*H01L 27/00*    (2006.01)
(Continued)

(52) U.S. Cl.
CPC .......... *H01L 33/46* (2013.01); *H01L 25/0753* (2013.01); *H01L 33/06* (2013.01);
(Continued)

(58) Field of Classification Search
CPC ....... H01L 33/461; H01L 33/06; H01L 33/32; H01L 33/62; H01L 33/58; H01L 33/405;
(Continued)

(56) References Cited

U.S. PATENT DOCUMENTS 6,492,661 B1 * 12/2002 Chien ................. H01L 33/0079
257/103
8,405,113 B2 * 3/2013 Kazama ................. H01L 33/20
257/86
(Continued)

FOREIGN PATENT DOCUMENTS

EP    2 390 933    11/2011
KR    10-0966372 B1    6/2010
(Continued)

OTHER PUBLICATIONS

European Search Report dated Aug. 18, 2016 issued in Application No. 15202624.1.

*Primary Examiner* — Nikolay Yushin
(74) *Attorney, Agent, or Firm* — KED & Associates, LLP

(57) ABSTRACT

A light emitting device is provided that may include a light emitting structure including a first conductivity-type semiconductor layer, an active layer provided on the first conductivity-type semiconductor layer, and a second conductivity-type semiconductor layer provided on the active layer, a first electrode that conductively contacts the first conductivity-type semiconductor layer, an insulating layer provided on a portion of the light emitting structure and the first electrode, and a second electrode that conductively contacts the second conductivity-type semiconductor layer, the first electrode including a first portion protruding from a side surface of the first conductivity-type semiconductor layer.

20 Claims, 13 Drawing Sheets

(51) Int. Cl.
*H01L 33/46* (2010.01)
*H01L 25/075* (2006.01)
*H01L 33/20* (2010.01)
*H01L 33/38* (2010.01)
*H01L 33/44* (2010.01)
*H01L 33/06* (2010.01)
*H01L 33/32* (2010.01)
*H01L 33/58* (2010.01)
*H01L 33/62* (2010.01)
*H01L 33/42* (2010.01)
*H01L 33/40* (2010.01)
*H01L 27/15* (2006.01)

(52) U.S. Cl.
CPC .............. *H01L 33/20* (2013.01); *H01L 33/32* (2013.01); *H01L 33/382* (2013.01); *H01L 33/385* (2013.01); *H01L 33/44* (2013.01); *H01L 33/58* (2013.01); *H01L 33/62* (2013.01); *H01L 27/156* (2013.01); *H01L 33/405* (2013.01); *H01L 33/42* (2013.01); *H01L 2924/0002* (2013.01)

(58) Field of Classification Search
CPC ......... H01L 33/46; H01L 33/44; H01L 33/20; H01L 33/382; H01L 33/385; H01L 33/42; H01L 25/0753; H01L 27/156; H01L 27/15; H01L 27/153
See application file for complete search history.

(56) References Cited

U.S. PATENT DOCUMENTS

| | | | | |
|---|---|---|---|---|
| 8,536,605 | B2* | 9/2013 | West | H01L 33/56 257/88 |
| 8,735,910 | B2* | 5/2014 | Kang | H01L 25/0756 257/88 |
| 8,969,898 | B2* | 3/2015 | Onishi | H01L 33/44 257/100 |
| 2004/0066307 | A1* | 4/2004 | Lin | H05K 1/0274 340/815.45 |
| 2010/0078656 | A1 | 4/2010 | Seo et al. | |
| 2013/0214320 | A1* | 8/2013 | Onishi | H01L 33/44 257/99 |

FOREIGN PATENT DOCUMENTS

| | | |
|---|---|---|
| KR | 10-2011-0140074 A | 12/2011 |
| KR | 10-2014-0111254 A | 9/2014 |
| WO | WO 2008/060053 | 5/2008 |
| WO | WO 2014/038776 | 3/2014 |

* cited by examiner

LIGHT EMITTING DEVICE, LIGHT EMITTING DEVICE ARRAY AND LIGHTING APPARATUS INCLUDING THE SAME

CROSS-REFERENCE TO RELATED APPLICATION

This application claims priority under 35 U.S.C. §119 to Korean Patent Application No. 10-2014-0190407 filed in Korea on Dec. 26, 2014, whose entire disclosure is incorporated herein by reference.

BACKGROUND

1. Field

Embodiments relate to a light emitting device, a light emitting device array and a lighting apparatus including the same.

2. Background

Group III-V compound semiconductors, such as, e.g., GaN and AlGaN, have many advantages, for example, wide and easily controllable band gap energies, and are thus widely used for optoelectronics and electronics.

Light emitting devices, for example, light emitting diodes or laser diodes, which use group III-V or II-VI compound semiconductors, are capable of emitting visible and ultraviolet light of various colors, such as, e.g., red, green, and blue, owing to the development of device materials and thin film growth techniques. These light emitting devices are also capable of emitting white light with high luminous efficacy by utilizing a fluorescent substance or by combining colors. Light emitting devices have several advantages, for example, low power consumption, semi-permanent lifespans, fast response speeds, safety, and environmental friendliness, compared to conventional light sources, such as fluorescent lamps and incandescent lamps.

Application of the light emitting devices has been extended to, for example, transmission modules of optical communication means, light emitting diode backlights to replace Cold Cathode Fluorescent Lamps (CCFLs) which may serve as backlights of Liquid Crystal Display (LCD) apparatuses, white light emitting diode lighting apparatuses to replace fluorescent lamps or incandescent lamps, vehicle headlights, and traffic lights.

As application of the light emitting devices as light sources for portable apparatuses or lighting apparatuses increases, light emitting diodes with excellent optical characteristics and small sizes have been developed.

A light emitting device array, in which a plurality of light emitting diodes may be arranged on a PCB and conductively connected, requires fine process management in bonding or wiring due to the small sizes of the light emitting diodes, and thus, requires improvement in production efficiency.

BRIEF DESCRIPTION OF THE DRAWINGS

The embodiments will be described in detail with reference to the following drawings in which like reference numerals refer to like elements wherein.

DETAILED DESCRIPTION

Figure 1:
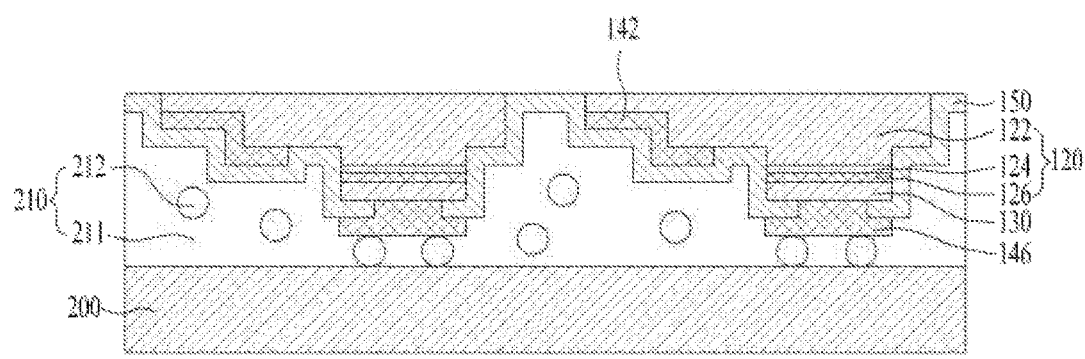
FIG. 1 is a cross-sectional view of a light emitting device array in accordance with an embodiment.

FIG. 1 is a cross-sectional view of a light emitting device array in accordance with an embodiment. The light emitting device array may include a circuit board 200, a plurality of light emitting devices provided on the circuit board 200, and a resin layer 210 filling a space between the circuit board 200 and the light emitting devices. The circuit board 200 may be a printed circuit board (PCB) or a flexible printed circuit board (FPCB).

In FIG. 1, an electrode pattern may be formed on a surface of the circuit board 200 at positions facing second electrodes 146 of the light emitting devices. For example, the electrode pattern formed on the circuit board 200 and the second electrodes 146 of the light emitting devices may be conductively connected. A plurality of light emitting devices may be provided on the circuit board 200.

If a FPCB is used as the circuit board 200, a flexible light emitting device array may be implemented due to flexibility of the FPCB supporting the light emitting device array.

Figure 2A:
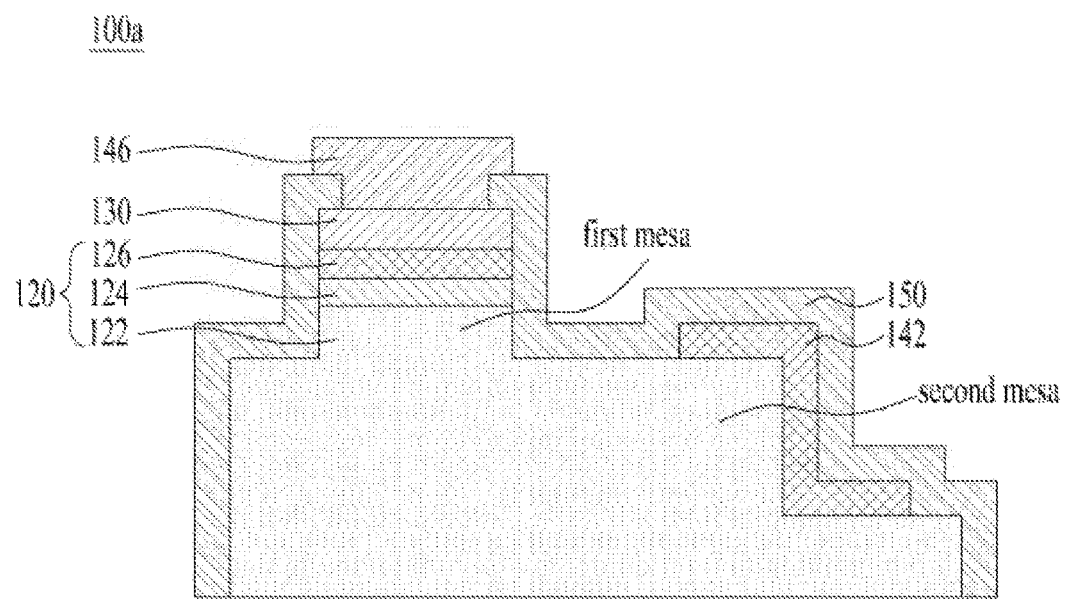
FIGS. 2A to 2C are cross-sectional views illustrating light emitting devices in accordance with embodiments.
Figure 2B:
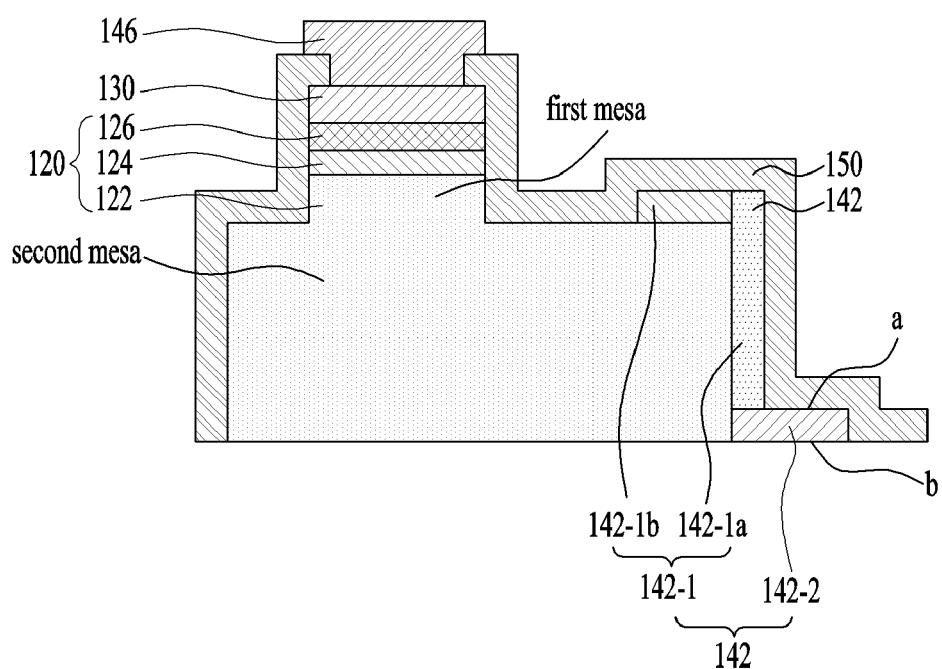
Figure 2C:
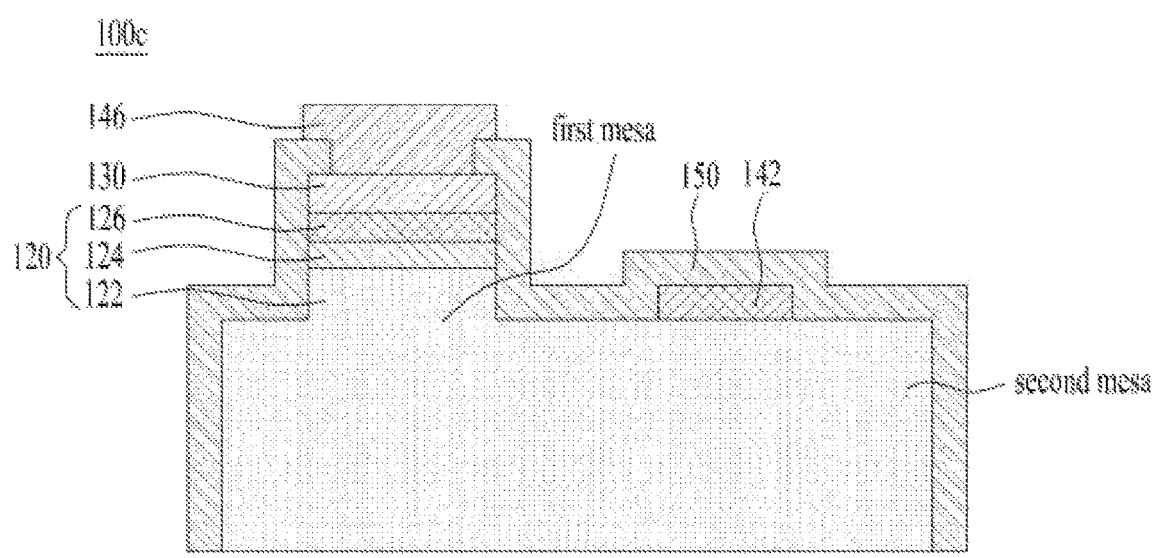

FIGS. 2A to 2C are cross-sectional views illustrating light emitting devices 100a, 100b and 100c in accordance with embodiments disclosed herein. FIG. 2A illustrates a light emitting device 100a in accordance with an embodiment which is included in the light emitting device array shown in FIG. 1. Further, FIGS. 2B and 2C illustrate light emitting devices 100b and 100b in accordance with other embodiments having first electrodes 142 provided differently from the light emitting device 100a of FIG. 2A.

In FIGS. 2A to 2C, the light emitting devices 100a, 100b and 100c may include a light emitting structure 120 including a first conductivity-type semiconductor layer 122, an active layer 124 provided on the first conductivity-type semiconductor layer 122 and a second conductivity-type semiconductor layer 126 provided on the active layer 124, a first electrode 142 formed on the first conductivity-type semiconductor layer 122, and a second electrode 146 formed on the second conductivity-type semiconductor layer 126.

The light emitting devices 100a, 100b and 100c may further include a conductive layer 130 on the second conductivity-type semiconductor layer 126. The second electrode 146 may be provided on the conductive layer 130.

The first conductivity-type semiconductor layer 122 may be formed of a compound semiconductor, for example, a group III-V or group II-VI compound semiconductor, and may be doped with a first conductivity-type dopant. The first conductivity-type semiconductor layer 122 may be formed of a semiconductor material having a composition of $Al_xIn_yGa_{(1-x-y)}N$ ($0 \leq x \leq 1$, $0 \leq y \leq 1$, $0 \leq x+y \leq 1$) formed of, for example, one or more of AlGaN, GaN, InAlGaN, AlGaAs, GaP, GaAs, GaAsP and AlGaInP.

If the first conductivity-type semiconductor layer 122 is an n-type semiconductor layer, the first conductivity-type dopant may be an n-type dopant, such as Si, Ge, Sn, Se, or Te. The first conductivity-type semiconductor layer 122 may be formed to have a single layered structure or a multilayered structure, but the disclosure is not limited thereto.

The active layer 124 may be provided between the first conductivity-type semiconductor layer 122 and the second conductivity-type semiconductor layer 126 and include any one of a single well structure, a multi-well structure, a single quantum well structure, a multi-quantum well (MQW) structure, a quantum dot structure and a quantum wire structure.

The active layer 124 may be formed of a compound semiconductor, for example, a group III-V compound semiconductor, and have a paired structure including a well layer and a barrier layer, for example, one or more of AlGaN/AlGaN, InGaN/GaN, InGaN/InGaN, AlGaN/GaN, InAlGaN/GaN, GaAs(InGaAs)/AlGaAs and GaP(InGaP)/AlGaP, but the disclosure is not limited thereto. The well layer may be formed of a material having a lower energy band gap than the energy band gap of the barrier layer.

The second conductivity-type semiconductor layer 126 may be formed on the surface of the active layer 124. The second conductivity-type semiconductor layer 126 may be formed of a compound semiconductor, for example, a group III-V or group II-VI compound semiconductor, and may be doped with a second conductivity-type dopant. The second conductivity-type semiconductor layer 126 may be formed of a semiconductor having a composition of $In_xAl_yGa_{1-x-y}N$ ($0 \leq x \leq 1$, $0 \leq y \leq 1$, $0 \leq x+y \leq 1$) formed of, for example, one or more of AlGaN, GaN, AlInN, AlGaAs, GaP, GaAs, GaAsP and AlGaInP. The second conductivity-type semiconductor layer 126 may be formed of $Al_xGa_{(1-x)}N$.

If the second conductivity-type semiconductor layer 126 is a p-type semiconductor layer, the second conductivity-type dopant may be a p-type dopant, such as Mg, Zn, Ca, Sr or Ba. The second conductivity-type semiconductor layer 126 may be formed to have a single layered structure or a multilayered structure, but the disclosure is not limited thereto.

The conductive layer 130 may be provided on the second conductivity-type semiconductor layer 126. The conductive layer 130 may improve electrical characteristics of the second conductivity-type semiconductor layer 126 and conductive contact between the second conductivity-type semiconductor layer 126 and the second electrode 146. The conductive layer 130 may be formed as a plurality of layers or patterns and may be a transparent electrode layer having a light transmitting property.

The conductive layer 130 may include, for example, at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), zinc oxide (ZnO), iridium oxide (IrOx), ruthenium oxide (RuOx), nickel oxide (NiO), RuOx/ITO, and Ni/IrOx/Au (Gold), but is not limited thereto.

With reference to FIGS. 2A to 2C, the light emitting structure 120 may have at least one mesa region. Here, the mesa region corresponds to a region including the upper and side surfaces of a structure formed by mesa etching.

For example, in the light emitting devices shown in FIGS. 2A to 2C, a first mesa region may include the first conductivity-type semiconductor layer 122, the active layer 124 and the second conductivity-type semiconductor layer 126, and a second mesa region may include the first conductivity-type semiconductor layer 122 alone. The first mesa region may be provided on the second mesa region.

Although FIGS. 2A to 2C show the first mesa region and the second mesa region having side surfaces which are almost vertical, the disclosure is not limited thereto. The side surfaces of the mesa regions may be inclined by a designated or predetermined angle relative to the bottom surface of the light emitting device.

The first electrode 142 and the second electrode 146 may be provided on the first conductivity-type semiconductor layer 122 and the second conductivity-type semiconductor layer 126. The first electrode 142 may be provided on a partial region of the first conductivity-type semiconductor layer 122 exposed by mesa etching.

With reference to FIG. 2A, the first electrode 142 may be provided on a part or portion of an upper surface of the first conductivity-type semiconductor layer 122 forming the second mesa region, the side surface of the second mesa region and the first conductivity-type semiconductor layer 122 exposed by etching of the second mesa region and forming a height difference with the second mesa region.

For example, the first electrode 142 may be spaced from the side surface of the first mesa region by 2 μm to 10 μm. The first electrode 142, spaced from the side surface of the first mesa region and provided on a partial region of the first conductivity-type semiconductor layer 122, may extend to the edge of the second mesa region. A part or portion of the first electrode 142 provided on the upper surface of the second mesa region may have a horizontal width of 5 μm to 15 μm, for example, 10 μm. A part or portion of the first electrode 142 extending from the upper surface, the side surface and the edge of the second mesa region may have a horizontal width of 10 μm to 30 μm, for example, 20 μm.

Figure 3:
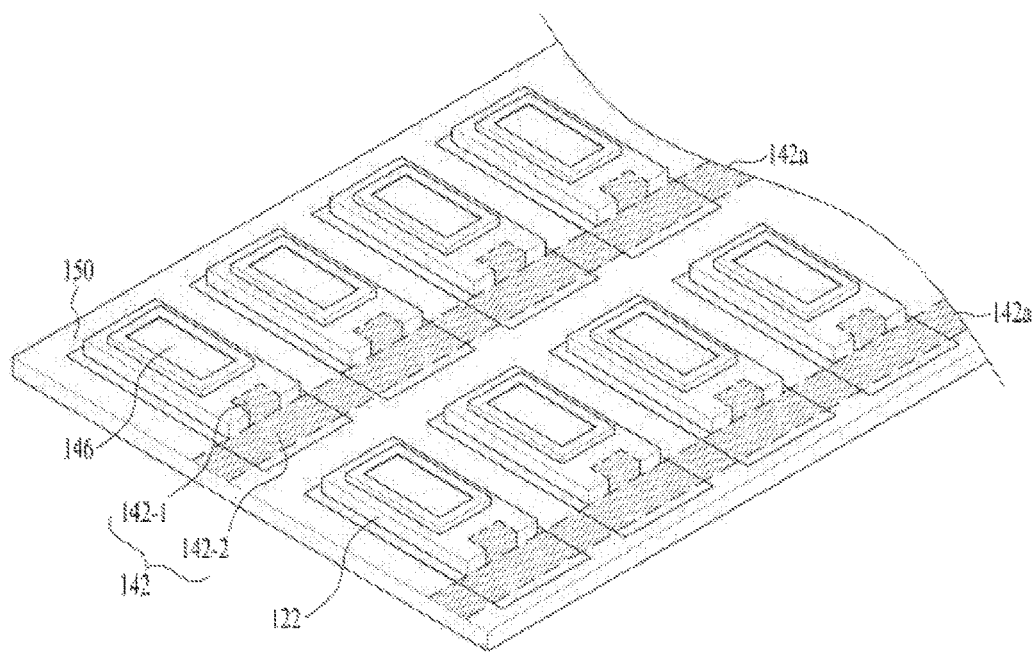
FIG. 3 is a view illustrating an arrangement of a plurality of light emitting devices of FIG. 1.

However, such a configuration is provided to describe one example and, as shown in FIG. 3, a part or portion of the first electrode 142 provided on the upper surface of the second mesa region and a part or portion of the first electrode 142 extending from the upper surface, the side surface and the edge of the second mesa region may have the same horizontal width.

In a light emitting device 100*b* in accordance with another embodiment as shown in FIG. 2B, a first electrode 142 may be formed on a part or portion of an upper surface of the first conductivity-type semiconductor layer 122, for example, a part of the upper surface of the second mesa region, formed on the side surface of the second mesa region, and extend from the edge of the second mesa region.

In the embodiment as shown in FIG. 2B, an insulating layer 150 may be formed on a first surface a of the part of the first electrode 142 extending from the edge of the second mesa region, and a second surface b of the part of the first electrode 142 extending from the edge of the second mesa region may be exposed.

With reference to FIG. 2C, a first electrode 142 may be provided on a partial region of the first conductivity-type semiconductor layer 122 exposed in a first mesa region formation process.

With reference to FIGS. 2A to 2C, the second electrode 146 may be provided on the second conductivity-type semiconductor layer 126. The conductive layer 130 may be provided on the second conductivity-type semiconductor layer 126, and the insulating layer 150 may be provided so as to cover a part of the upper surface of the conductive layer 130 and the side surface of the conductive layer 130. The central region of the upper surface of the conductive layer 130 may not be covered with the insulating layer 150 and may be opened. That is, the insulating layer 150 may be provided on a part of the light emitting structure 120 and provided on the first electrode 142.

With reference to FIGS. 2A to 2C, the conductive layer 130 may be provided on the second conductivity-type semiconductor layer 126 and the second electrode 146 may contact the conductive layer 130 in an open region of the conductive layer 130.

The second electrode 146 may be conductively connected to the second conductivity-type semiconductor layer 126 and may supply power, supplied from outside, to the second conductivity-type semiconductor layer 126. For example, in the light emitting device array as shown in FIG. 1, the second electrode 146 may be conductively connected to the circuit board 200 by an anisotropic conductive film (ACF).

The first electrode 142 and the second electrode 146 may be formed to have a single layered structure or a multilayered structure using a conductive material, for example, a metal or an alloy selected from the group consisting of indium (In), cobalt (Co), silicon (Si), germanium (Ge), gold (Au), palladium (Pd), platinum (Pt), ruthenium (Ru), rhenium (Re), magnesium (Mg), zinc (Zn), hafnium (Hf), tantalum (Ta), rhodium (Rh), iridium (Ir), tungsten (W), titanium (Ti), silver (Ag), chrome (Cr), molybdenum (Mo), niobium (Nb), aluminum (Al), nickel (Ni), copper (Cu) and a titanium-tungsten (WTi) alloy, but is not limited thereto.

For example, the first electrode 142 may include a plurality of electrode layers including an ohmic layer, a reflective layer and a bonding layer, and the second electrode 146 may include an ohmic layer and reflective layer. The ohmic layer may include chrome (Cr) or silver (Ag), the reflective layer may have any one structure of platinum (Pt)/gold (Au)/nickel (Ni)/gold (Au), aluminum (Al)/platinum (Pt)/gold (Au) and aluminum (Al)/nickel (Ni)/gold (Au), and the bonding layer may include titanium (Ti).

With reference to FIG. 1, the insulating layer 150 may be provided on the exposed surface of the light emitting structure 120 and the first electrode 142. That is, the insulating layer 150 may be provided on the exposed first conductivity-type semiconductor layer 122, the side surface of the first mesa region, a part of the surface of the second conductivity-type semiconductor layer 126 and the first electrode 142.

The insulating layer 150 may be formed of an insulating material so as to prevent conductive contact between the first conductivity-type semiconductor layer 122 and the second conductivity-type semiconductor layer 126 and may be formed of a material having high reflectivity, for example, having a distributed Bragg reflector (DBR) structure, to reflect light emitted from the active layer 124.

Further, the insulating layer 150 may surround the entirety of the first electrode 142 to prevent conductive contact between the first electrode 142 and a resin layer 210 and be formed of a material, for example, SiO$_2$, Si$_3$N$_4$ or polyimide. If the insulating layer 150 is formed of polyimide, the light emitting device array may be flexible.

FIG. 3 is a view illustrating an arrangement of a plurality of light emitting devices in the light emitting device array, that is, the light emitting device array in which a plurality of light emitting devices is provided except for the circuit board.

The insulating layer 150 may be formed on the entirety of the upper surface of the light emitting device array except for the exposed second electrodes 146.

The light emitting device shown in FIG. 3 may be the light emitting device 100a having the structure shown in FIG. 2A. With reference to FIG. 3, a first electrode line 142a may be formed by connecting parts of the first electrodes 142 of light emitting devices neighboring to each other in a first direction among the light emitting devices.

In the light emitting device array of FIG. 3, the first electrode line 142a may be formed by connecting parts of the first electrodes 142 of light emitting devices neighboring to each other in the first direction. The first electrode line 142a may be provided between the insulating layer 150 and the first conductivity-type semiconductor layer 122 so as to conductively connect the first electrodes 142 to each other.

For example, in FIG. 3, assuming that a part or portion of the first electrode 142 formed on the upper and side surfaces of the second mesa region is defined as a second part 142-1 and a part or portion of the first electrode 142 forming a height difference with the second mesa region and formed on the first conductivity-type semiconductor layer 122 exposed by etching of the second mesa region is defined as a first part 142-2, the first electrode line 142a may be formed by connecting the first parts 142-2 of the first electrodes 142 to each other.

In FIG. 2B, for convenience of description, second part 142-1 may be formed on the upper and side surfaces of the second mesa region and first part 142-2 may be protruding from the side surface of the first conductivity-type semiconductor layer 122. Further, in FIG. 2B, the first electrode 142 may include a first part 142-2 protruding from the side surface of the first conductivity-type semiconductor layer 122, a second part 142-1a provided on the side surface of the second mesa region of the first conductivity-type semiconductor layer 122, and a third part 142-1b provided on the upper surface of the second mesa region of the first conductivity-type semiconductor layer 122, and the first electrode line 142a may be provided to conductively connect one or more first parts 142-2 to each other. That is, the first electrode line 142a may be a region in which the first parts 142-2 of the first electrodes 142 extending from the edge of the second mesa region may be provided.

A plurality of first electrode lines 142a, each of which may connect the first electrodes 142 of light emitting devices neighboring to each other in the first direction, may be formed, and the first electrode lines 142a may be parallel to each other. The first electrode lines 142a may be formed in the first electrode formation process of the light emitting devices. That is, a wiring structure of the first electrode lines 142a may be formed during a wafer-level light emitting device fabrication process.

The first electrode lines 142a may be formed of the same material as the first electrodes 142 and, if the first electrodes 142 are formed to have a multilayered structure, the first electrode lines 142a may also have a multilayered structure.

Referring to FIG. 1, the resin layer 210 may fill a space between the circuit board 200 and the light emitting devices in the light emitting device array in accordance with the embodiment. The resin layer 210 may include a resin part 211 and conductive balls 212 and the resin layer 210 of FIG. 1 may be an anisotropic conductive film (ACF).

In FIG. 1, the conductive balls 212 may be provided between the second electrodes 146 and the circuit board 200 and the circuit board 200 and the second electrodes 146 may be conductively connected by the conductive balls 212. Conductive connection by the conductive balls 212 may be carried out through contact of the conductive balls 212 with the electrode pattern of the circuit board 200 and both sides of the second electrodes 146 of the light emitting devices by applying heat and pressure in manufacturing the light emitting device array.

Further, the first electrode lines 142a formed on the light emitting devices may be conductively connected to a side of the circuit board 200. When the first electrode line 142a is connected to electrode lines of the circuit board 200, connectors may be used. Otherwise, the first electrode line 142a may be connected to external electrode lines extending from the circuit board 200 by an ACF.

Figure 4:
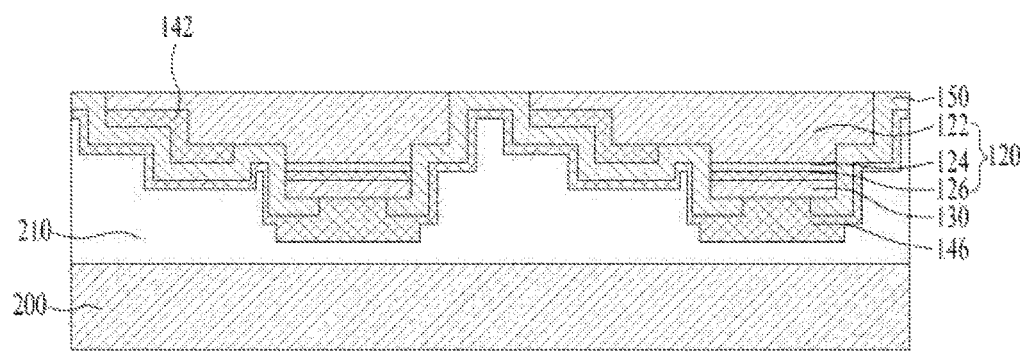
FIG. 4 is a cross-sectional view of a light emitting device array in accordance with another embodiment.

FIG. 4 is a cross-sectional view of a light emitting device array in accordance with another embodiment. Description of elements or components of the light emitting device array of FIG. 4, which may be substantially the same as those of the light emitting device array in accordance with above-described embodiments, has been omitted.

The light emitting device array of FIG. 4 may include a circuit board 200, a plurality of light emitting devices provided on the circuit board 200, and a resin layer 210 filling a space between the circuit board 200 and the light emitting devices.

The circuit board 200 in accordance with the embodiment shown in FIG. 4 may not include an electrode pattern. Therefore, if the light emitting devices are provided on the circuit board 200, a fine alignment process may not be required.

Further, different from the former embodiment of FIG. 1, in the embodiment of FIG. 4, the resin layer 210 may be provided between the circuit board 200 and the light emitting devices and formed of a thermosetting resin, for example, epoxy resin.

The light emitting devices may include a light emitting structure 120 including a first conductivity-type semiconductor layer 122, an active layer 124 and a second conductivity-type semiconductor layer 126 provided on the active layer 124, a first electrode 142 formed on a partial region of the first conductivity-type semiconductor layer 122, an insulating layer 150 provided on the exposed surface of the light emitting structure 120 and the first electrode 142, and a second electrode 146 provided on the second conductivity-type semiconductor layer 126.

The light emitting devices may further include a conductive layer 130 on the second conductivity-type semiconductor layer 126. Further, the light emitting devices may include first electrode lines formed by connecting the first electrodes 142 of light emitting devices neighboring to each other in a first direction and second electrode lines formed by connecting the second electrodes 146 of light emitting devices neighboring to each other in a second direction perpendicular to the first direction.

The second electrode lines may be formed on the insulating layer 150 along rough areas of opened regions of the conductive layer 130 and the insulating layer 150.

Figure 5:
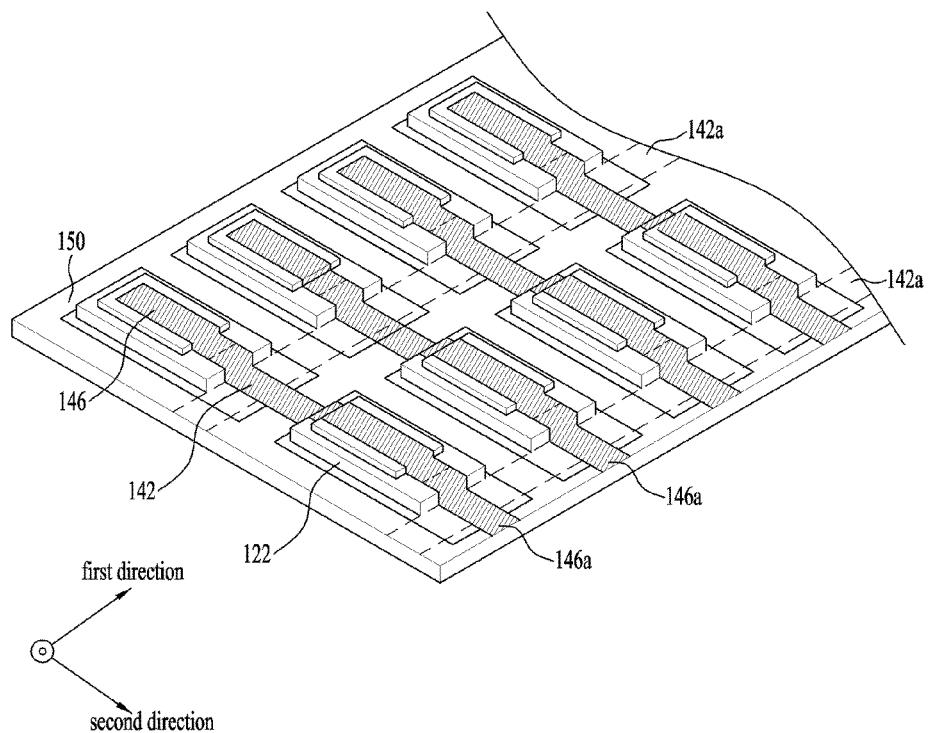
FIG. 5 is a view illustrating an arrangement of a plurality of light emitting devices of FIG. 4.

FIG. 5 is a view illustrating an arrangement of a plurality of light emitting devices which are not bonded to the circuit board in the light emitting device array in accordance with the embodiment of FIG. 4. With reference to FIG. 5, the first electrode lines 142a provided in the first direction may be parallel to each other and the second electrode lines 146a provided in the second direction perpendicular to the first direction may be parallel to each other.

The first electrode lines 142a and the second electrode lines 146a may intersect perpendicularly and overlap each other on the first conductivity-type semiconductor layer 122. For example, with reference to FIG. 5, the first electrode lines 142a and the second electrode lines 146a may intersect each other on the first conductivity-type semiconductor layer 122 in the second mesa region and the insulating layer 150 may be provided between the first electrode lines 142a and the second electrode lines 146a to prevent conductive contact therebetween.

First surfaces of the second electrode lines 146a facing the circuit board 200 may be exposed to the insulating resin layer 210, and second surfaces of the second electrode lines 146a may contact the insulating layer 150.

The first electrode lines 142a and the second electrode lines 146a may be formed of the same materials as the first electrodes 142 and the second electrodes 146 and may be formed on the entirety of the light emitting devices of the light emitting device array through a patterning process when the first electrodes 142 and the second electrodes 146 are formed.

The first electrode lines 142a and the second electrode lines 146a may extend and be conductively connected to one side of the circuit board 200. The first electrode lines 142a and the second electrode lines 146a may be connected to the circuit board 200 by connectors, or the first electrode lines 142a and the second electrode lines 146a may be connected to external electrode lines extending from the circuit board 200 by an ACF.

Figure 6:
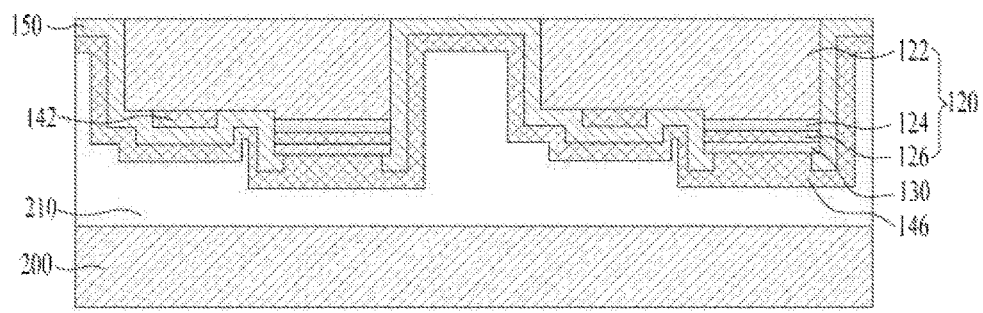
FIG. 6 is a cross-sectional view of a light emitting device array in accordance with a further embodiment.

FIG. 6 is a cross-sectional view of a light emitting device array having light emitting devices with a structure differing from the structure of the light emitting devices in the embodiment of FIG. 4. The light emitting device array of FIG. 6 may include the light emitting devices 100c shown in FIG. 2C.

Similar to the embodiment of FIG. 4, in the embodiment of FIG. 6, first electrode lines and second electrode lines may be simultaneously formed during an electrode formation process of the light emitting devices.

Figure 7:
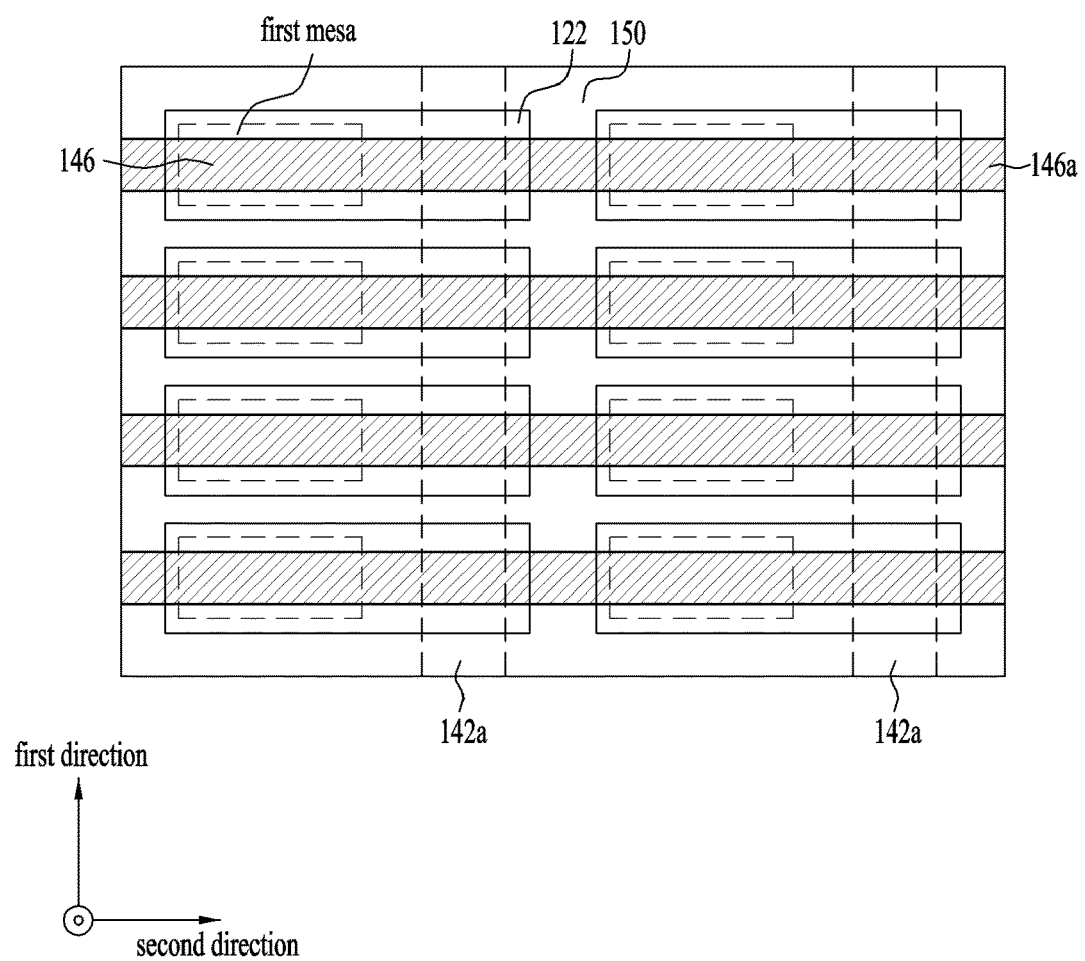
FIG. 7 is a view illustrating an arrangement of a plurality of light emitting devices of FIG. 6.

FIG. 7 is a view illustrating an arrangement of a plurality of light emitting devices of the light emitting device array in accordance with the embodiment of FIG. 6.

With reference to FIGS. 6 and 7, an insulating layer 150 may be formed on the overall region of the light emitting devices except for opened regions of a conductive layer 130, second electrode lines 146a may be formed on the conductive layer 130 and the insulating layer 150, and the width of the second electrode lines 146a may be less than the width of the first mesa region.

For example, the width of the second electrode lines 146a may be 5 μm to 15 μm, for example, 6 μm to 10 μm. Further, the width of the second electrode lines 146a may be 50% to 100% of the width of the corresponding first mesa region, for example, 50% to 70% of the width of the first mesa region.

Figure 8:
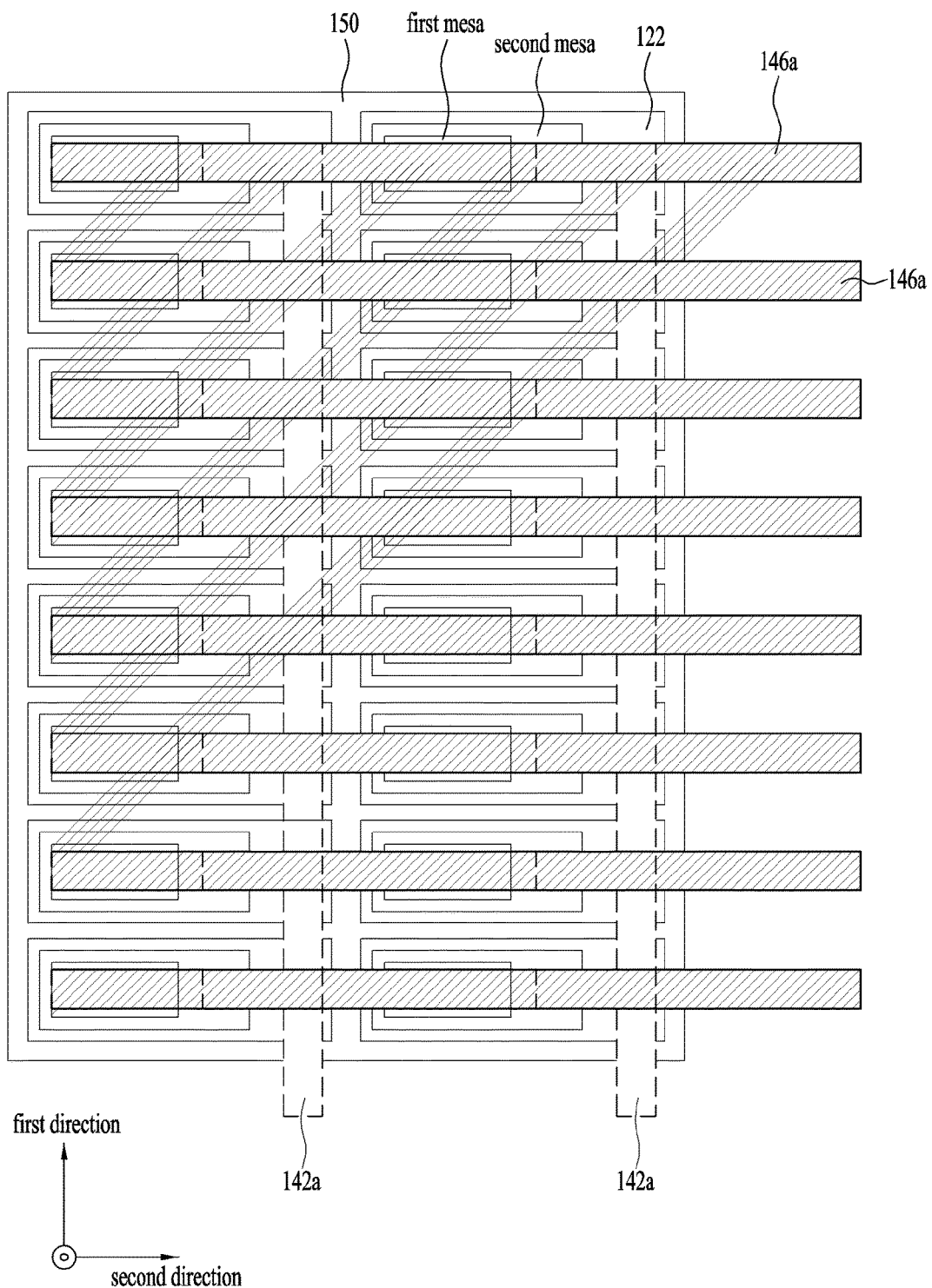
FIGS. 8 and 9 are plan views illustrating arrangements of a plurality of light emitting devices in accordance with embodiments.
Figure 9:
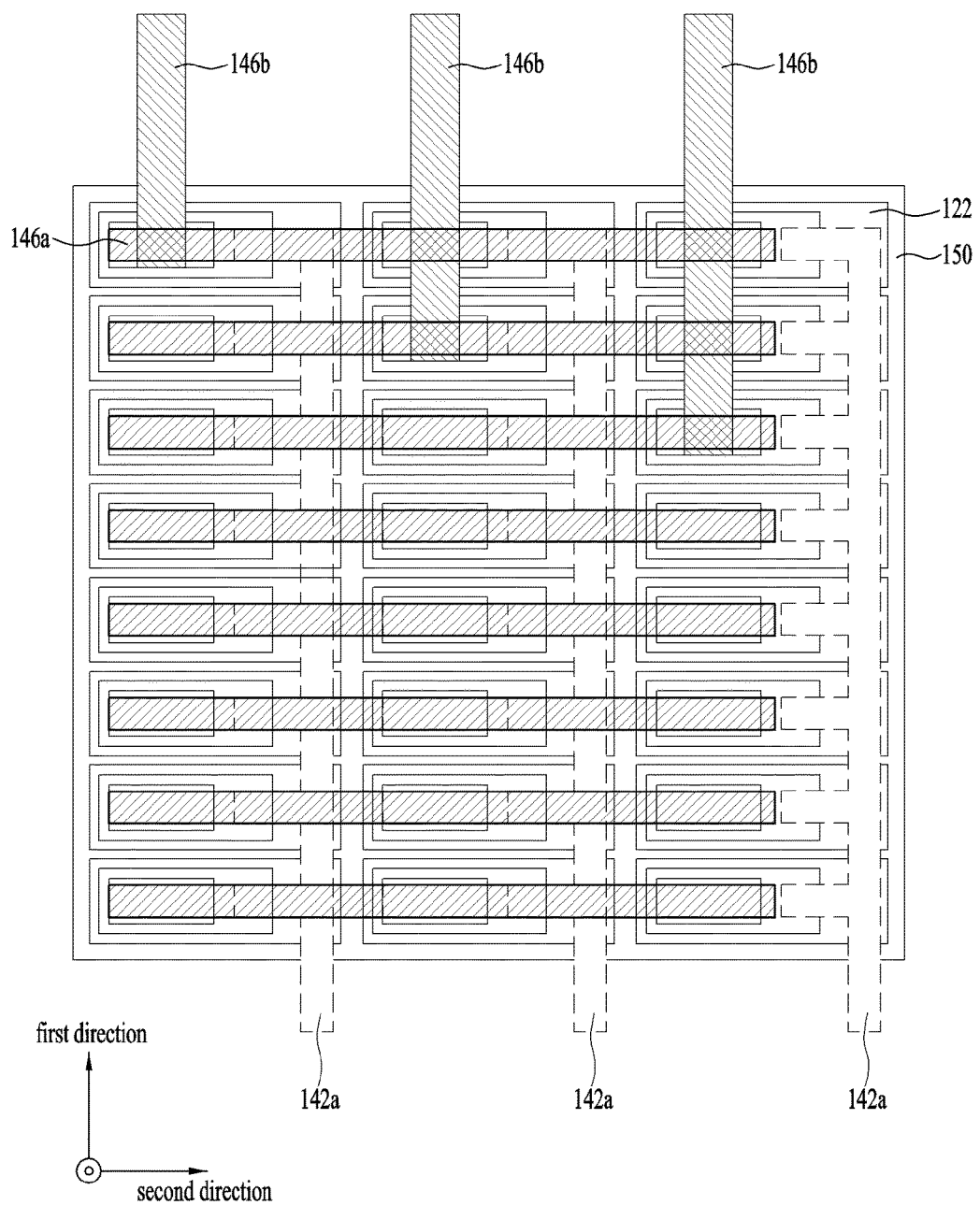

FIGS. 8 and 9 are plan views illustrating arrangements of first electrode lines 142a and second electrode lines 146a in a light emitting device array. A number of light emitting devices included in the light emitting device array is not limited to the described embodiments and may be greater or smaller than the number shown.

In the embodiment shown in FIG. 8, a plurality of first electrode lines 142a may extend in a first direction and may be exposed to the outside of the light emitting device array. Exposed parts or portions of the first electrode lines 142a may be connected to a circuit board.

A plurality of second electrode lines 146a may extend in a second direction perpendicular to the first direction and may be exposed to the outside of the light emitting device array, and the exposed parts or portions of the second electrode lines 146a may be connected to the circuit board. That is, in the embodiment of FIG. 8, the wiring direction of the first electrode lines 142a and the wiring direction of the second electrode liens 146a may be different.

In the embodiment shown in FIG. 9, a plurality of first electrode lines 142a may extend in the first direction and may be exposed to the outside of the light emitting device array, and a plurality of second electrode lines 146*a* may be formed by connecting a plurality of light emitting devices neighboring to each other in the second direction. The second electrode lines 146*a* may not be exposed in the second direction.

Further, external connection electrode lines 146*b* may be provided to supply external electricity to the respective second electrode lines 146*a*. The external connection electrode lines 146*b* may be provided parallel to the first electrode lines 142*a*.

If the light emitting devices are provided in the manner of FIG. 9, the external connection electrode line 146*b* may be connected to a part or portion of the second electrode line 146*a* provided on at least one light emitting device of each of the second electrode lines 146*a*. An insulating layer may be provided at intersections between the second electrode lines 146*a* and the external connection electrode lines 146*b* except for conductive connection regions between the second electrode lines 146*a* and the external connection electrode lines 146*b*.

The light emitting device arrays in accordance with the embodiments shown in FIGS. 7 to 9 are described such that the first electrode lines 142*a* and the second electrode lines 146*a* may be provided on a same surface, for example, on the first surfaces of the light emitting devices facing the circuit board, assuming that the light emitting devices are bonded to the circuit board.

However, the disclosure is not limited thereto and first electrode lines may be provided on another surface, for example, on the second surfaces of the light emitting devices, and exposed to the outside. For example, in the case of the light emitting device array including the light emitting devices 100*b* of FIG. 2B, the first electrode lines may be exposed to the outside.

In the case of the light emitting device array in accordance with the above-described embodiment in which the first electrode lines and the second electrode lines are formed at the wafer level, when the light emitting devices and the circuit board are bonded, the electrode pattern of the circuit board may not need to accurately coincide with electrode parts of the light emitting devices, and thus, productivity in a circuit board bonding process may be improved.

The first electrode lines may be provided parallel to the first direction, as exemplarily shown in FIG. 5, but are not limited thereto. That is, at least one of the first electrode lines may be provided so as to be inclined relative to the first direction by a designated angle.

Further, the second electrode lines may be provided parallel to the second direction, but are not limited thereto, or at least one of the second electrode lines may be provided so as to be inclined relative to the second direction by a designated angle.

Even if at least one of the first electrode lines or the second electrode lines is provided so as to be inclined relative to the first direction or the second direction by a designated angle in the circuit board bonding process, the light emitting device array may operate without any trouble and, thus, productivity in the circuit board bonding process may be improved.

Further, as a light emitting device array may be manufactured using a circuit board without an electrode pattern, various types of circuit boards may be used.

In the case of a light emitting device array in which second electrode lines are formed simultaneously with first electrode lines, a resin layer formed of an insulating material may be used. That is, as an ACF including conductive balls is not used and a material to increase bonding force between a circuit board and light emitting devices may be used, a choice of materials for the resin layer may be expanded.

FIGS. 10A to 10H are cross-sectional views illustrating a fabrication process of a light emitting device array, for example, a fabrication process of a light emitting device array shown in FIG. 4.

A plurality of light emitting devices of the light emitting device array may be fabricated through a single process on a wafer-level substrate.

Figure 10A:
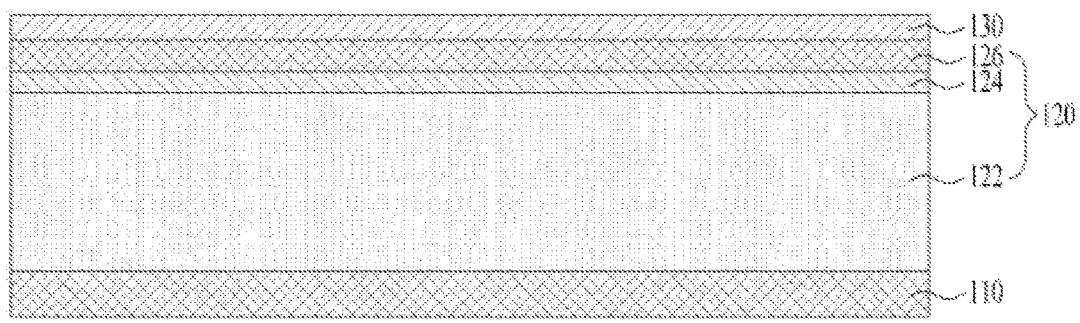
FIGS. 10A to 10H are cross-sectional views illustrating a fabrication process of a light emitting device array.

As exemplarily shown in FIG. 10A, light emitting structures 120 and a conductive layer 130 are grown on a substrate 110. The substrate 110 may be a conductive substrate or an insulating substrate, for example, be formed of at least one of sapphire ($Al_2O_3$), $SiO_2$, SiC, Si, GaAs, GaN, ZnO, GaP, InP, Ge and $Ga_2O_3$. The thickness of the substrate 110 may be several times to several hundred times the thicknesses of the light emitting structures 120 and the light-transmitting conductive layer 130, but the substrate 110 has been illustrated at a reduced thickness for convenience of description.

When the light emitting structures 120 are grown on the substrate 110 formed of sapphire, lattice mismatch between the light emitting structures 120 formed of a gallium nitride-based material and the substrate 120 may be great, and a difference in coefficients of thermal expansion therebetween may be great. Thus, dislocation, melt-back, cracks, pits, surface morphology defects and other causes of deterioration of crystallinity, may occur. Therefore, a buffer layer formed of AlN may be formed.

The light emitting structure 120 including a first conductivity-type semiconductor layer 122, an active layer 124 and a second conductivity-type semiconductor layer 126 may be formed through, for example, metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), etc., but is not limited thereto.

The conductive layer 130 formed of ITO may be formed on the second conductivity-type semiconductor layer 126. For example, the conductive layer 130 may be grown to a thickness of about 40 nm.

Figure 10B:
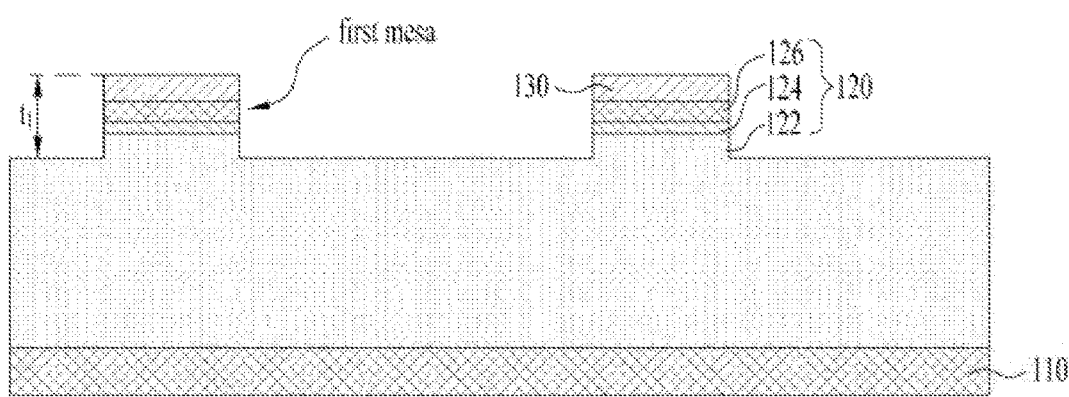

FIG. 10B is a view illustrating a first mesa region formation process. As shown in FIG. 10B, parts of the upper surface of the first conductivity-type semiconductor layer 122 may be exposed by executing first mesa etching of parts of the light emitting structures 120. The thickness t1 of the etched parts of the light emitting structures 120 may be about 1 μm. First mesa regions including the conductive layer 130, the second conductivity-type semiconductor layer 126, the active layer 124 and the first conductivity-type semiconductor layer 122 may be formed through first mesa etching.

Figure 10C:
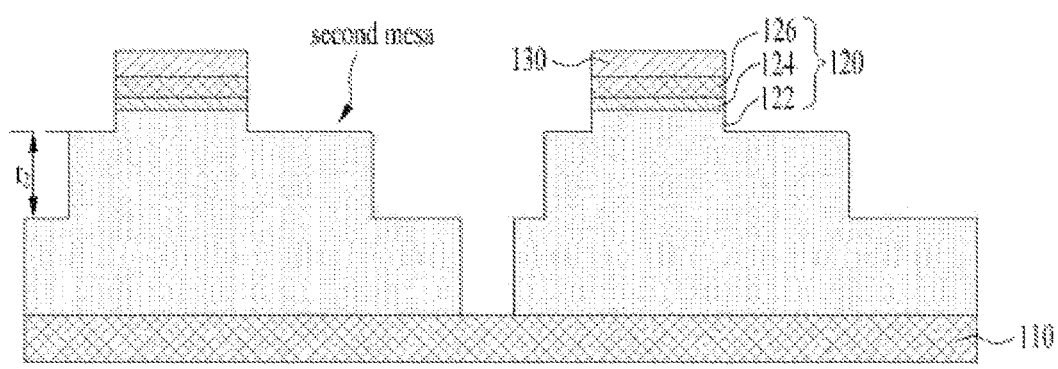

FIG. 10C is a view illustrating light emitting devices after a second mesa etching process. With reference to FIG. 10C, parts or portions of the first conductivity-type semiconductor layer 122 exposed by the first mesa etching process may form second mesa regions through the second mesa etching process.

The thickness t2 of the first conductivity-type semiconductor layer 122 in the second mesa regions formed through the second mesa etching process may be about 2 μm. Further, the first conductivity-type semiconductor layer 122 may be exposed from the upper surfaces of the second mesa regions.

Figure 10D:
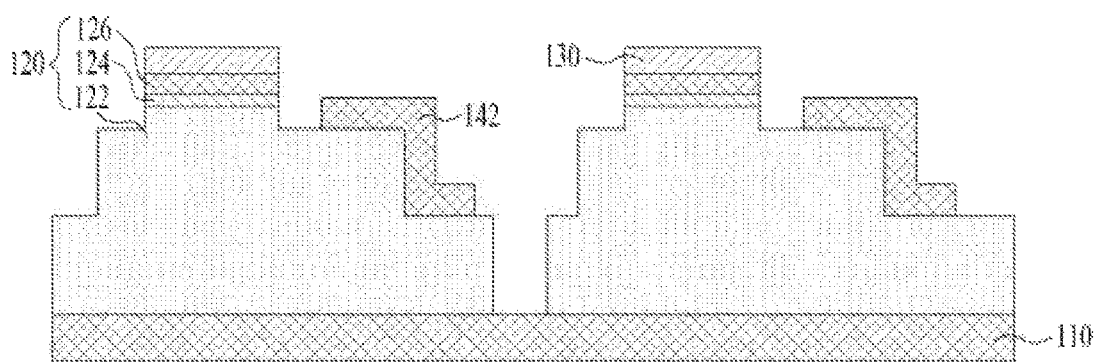

As shown in FIG. 10D, a first electrode 142 may be formed on a part or portion of the upper surface of the first conductivity-type semiconductor layer 122 forming the second mesa region, the side surface of the first conductivity-type semiconductor layer 122 and a part of the upper surface of the first conductivity-type semiconductor layer 122 having a height difference with the second mesa region.

The first electrodes 142 of light emitting devices neighboring to each other in a first direction may be connected to form a first electrode line. That is, the first electrode line may be formed in a wiring formation process at the wafer level during light emitting device fabrication. For example, the first electrode line may be formed only by connecting parts of the first electrodes on the first conductivity-type semiconductor layer 122 having a height difference with the second mesa regions.

Figure 10E:
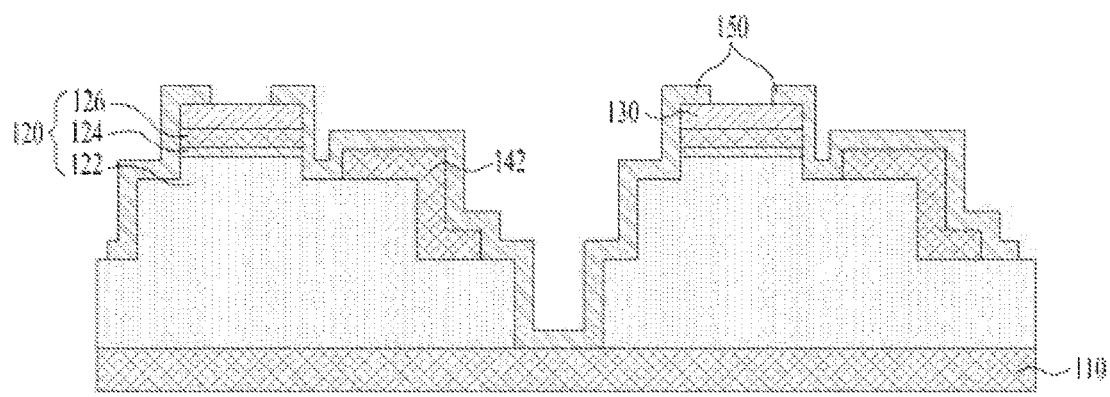

FIG. 10E is a view illustrating formation of an insulating layer 150. The insulating layer 150 may be formed on the light emitting structures 120 except for opened parts of the conductive layer 130, the first electrodes 142 and separation regions between the neighboring light emitting devices.

The insulating layer 150 may be formed along the shapes of the light emitting structures 120 and the first electrodes 142. Therefore, a height difference of the insulating layer 150 may be formed at a part or portion of the exposed first conductivity-type semiconductor layer in the second mesa region, in which no first electrode may be formed.

The insulating layer 150 may be grown through a method such as deposition, and formed of, for example, polyimide. Further, the insulating layer 150 may be formed to have a distributed Bragg reflector (DBR) structure.

Figure 10F:
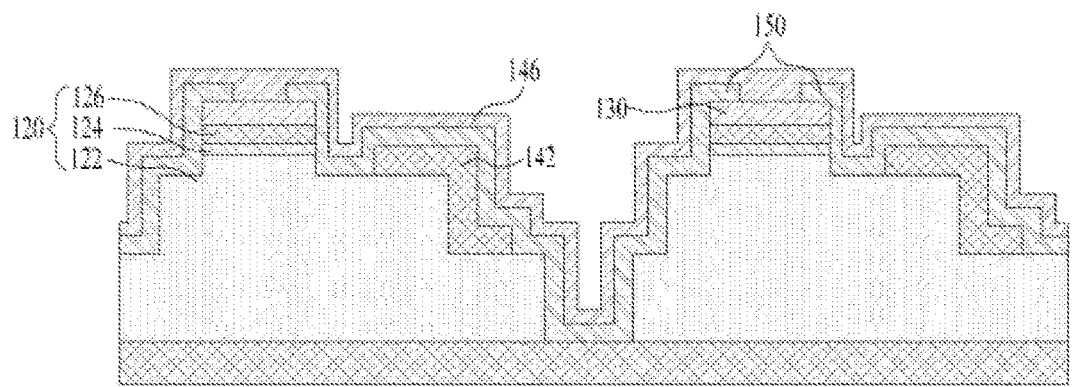

As shown in FIG. 10F, second electrodes 146 and a second electrode line extending from the second electrodes 146 may be grown on the exposed central regions of the conductive layer 130 and the insulating layer 150. The second electrode line may be formed of the same electrode material as the second electrodes 146 and formed through the patterning process at the wafer level.

Figure 10G:
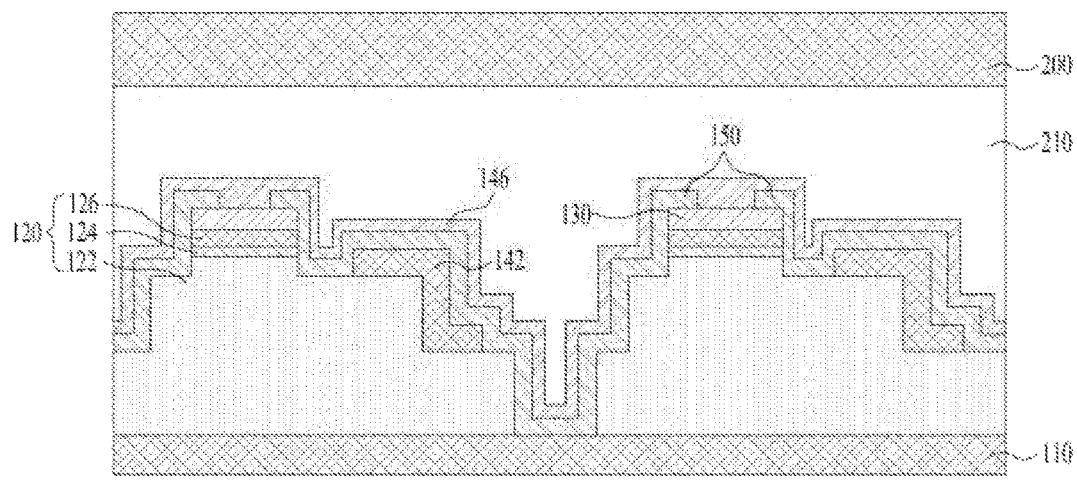

As shown in FIG. 10G, a process of forming a light emitting device array may be executed by bonding the light emitting devices to a circuit board 200. A resin layer 210 may fill a space between the circuit board 200 and the light emitting devices.

The first electrode lines and the second electrode lines may be formed at the wafer level, and the first and second electrode lines may extend to one side and be conductively connected to the circuit board 200. An anisotropic conductive film (ACF) may be used to connect the extending electrode lines to the circuit board 200.

Figure 10H:
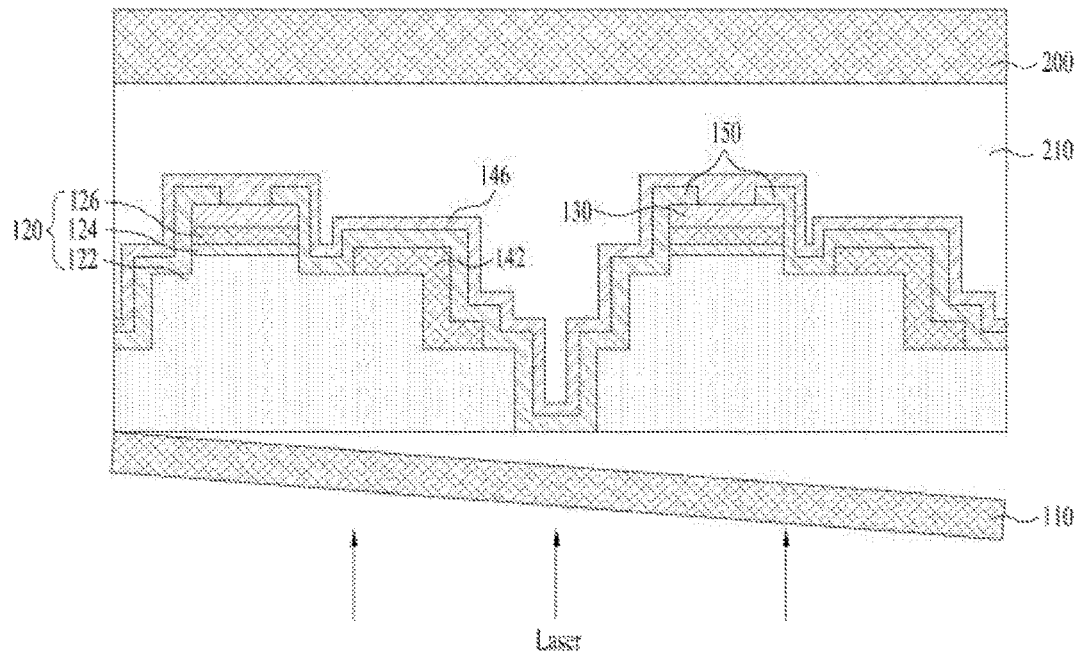

As shown in FIG. 10H, the substrate 110 may be removed. For example, if the substrate 110 is a sapphire ($Al_2O_3$) substrate, a laser lift off (LLO) method may be used to remove the substrate 110. If the substrate 110 is an Si substrate, a chemical lift off (CLO) method may be used to remove the substrate 110. However, the disclosure is not limited thereto, and various dry and wet etching methods may be used.

For example, in the case of the LLO method, an excimer laser beam having a designated wavelength may be focused and radiated in the direction of the substrate 110, heat energy may be concentrated on the interface between the substrate 110 and the light emitting structures 120, the interface may be separated into gallium and nitrogen molecules, and thus, the substrate 110 may be momentarily removed from the light emitting structures 120 in a region through which the laser beam passes.

After removal of the substrate 110, a part or portion of the exposed first conductivity-type semiconductor layer 122 may be removed. A part or portion of the lower surface of the first conductivity-type semiconductor layer 122, from which the substrate 110 may be separated, may be removed through an etching process, for example, until the first electrodes 142 are exposed to the outside.

The thickness of the removed part of the first conductivity-type semiconductor layer 122 may be 2 µm to 3 µm. The height of the light emitting device array except for the circuit board 200 may be several micrometers (µm), and the horizontal and vertical lengths of one light emitting device may be less than 100 µm. For example, the light emitting device may have a rectangular shape having a horizontal length of 82 µm and a vertical length of 30 µm.

A plurality of light emitting devices may be arranged in rows and columns so as to correspond pixels in various display apparatuses. For example, 400 light emitting devices may be arranged in the horizontal direction and 1080 light emitting devices may be arranged in the vertical direction, thus forming pixels of a display apparatus.

The light emitting device array in accordance with the above-described embodiment may be used in an apparatus requiring accuracy due to small-sized light emitting devices thereof and may allow a wiring process for supplying power to be carried out at the wafer level, and thus, improve productivity due to ease in the bonding process with the circuit board 200. The light emitting device array in accordance with the above-described embodiment may be included in a wearable device.

Figure 11:
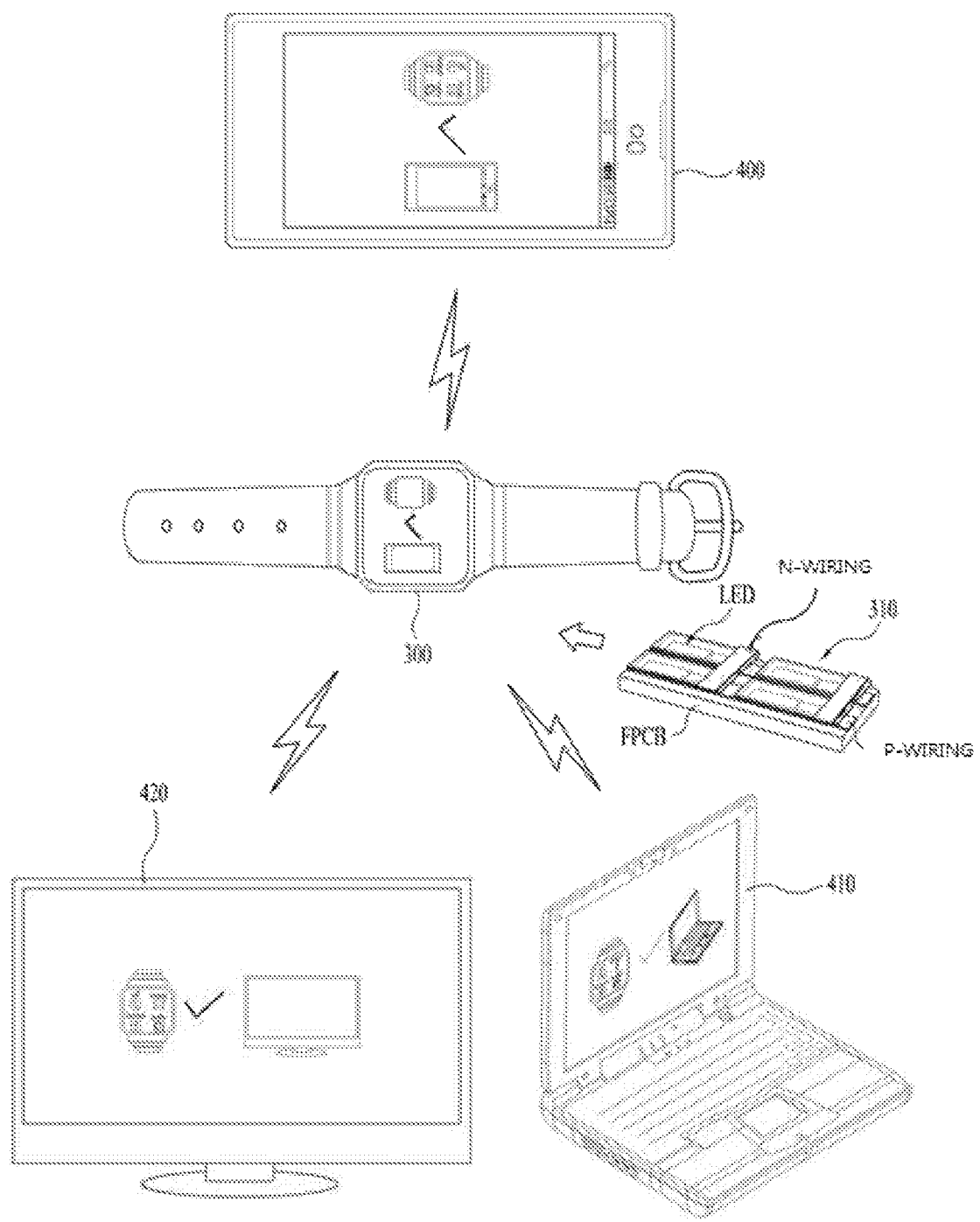
FIG. 11 is a view illustrating a smart watch in accordance with an embodiment.

FIG. 11 is a view illustrating a smart watch 300 including a light emitting device array in accordance with an embodiment. The smart watch 300 may execute pairing with external digital devices, and the external digital devices may be digital devices which may execute communication connection to the smart watch 300, for example, a smart phone 400, a notebook 410 and an Internet protocol television (IPTV) 420, which are shown in FIG. 11.

A light emitting device array 310 may be used as a light source of the smart watch 300, the smart watch 300 may be wearable on a user's wrist due to flexibility of a FPCB, and the light emitting device array 310 may implement fine pixels due to the fine size of light emitting devices.

In the light emitting device array, optical members, such as, e.g., a light guide panel, a prism sheet, and a diffusion sheet, may be provided in an optical path of the light emitting devices. The light emitting device array 310, the substrate and the optical members may function as a backlight unit.

A display apparatus, an indication apparatus and a lighting apparatus including the light emitting device array in accordance with the embodiment may be implemented.

The display apparatus may include a bottom cover, a reflective plate provided on the bottom cover, a light guide panel provided in front of the light emitting device array emitting light and the reflective plate and guiding light emitted from the light emitting device array in the forward direction, optical sheets including prism sheets provided in front of the light guide panel, a display panel provided in front of the optical sheets, an image signal output circuit connected to the display panel and supplying an image signal to the display panel, and a color filter provided in front of the display panel. The bottom cover, the reflective plate, the light emitting device array, the light guide panel and the optical sheets may form a backlight unit.

Further, the lighting apparatus may include a light source module including a substrate and the light emitting device array in accordance with the embodiment, a heat sink to dissipate heat generated from the light source module, and a power supply unit to process or convert an electrical signal provided from the outside and then to supply the processed or converted electrical signal to the light source module. For example, the lighting apparatus may include a lamp, a head lamp or a streetlamp.

The above-described image display apparatus or lighting apparatus includes the light emitting device array in accordance with the above-described embodiment and, thus, may have a small size and reduce restrictions in design due to flexibility of the light emitting device array.

In a light emitting device array and a lighting apparatus in accordance with embodiments disclosed herein, electrode line patterns may be formed by connecting electrodes of respective light emitting devices at the wafer level, and thus, a bonding process with a circuit board may be easily carried out. Damage to a semiconductor layer in a process of removing a substrate to grow the light emitting devices thereon may be reduced, and thus, productivity may be improved.

Embodiments disclosed herein provide a light emitting device and a light emitting device array in which electrode wiring may be formed at the wafer level prior to a bonding process with a circuit substrate, and thus, production efficiency may be improved.

In an embodiment disclosed herein, a light emitting device may include a light emitting structure including a first conductivity-type semiconductor layer, an active layer provided on the first conductivity-type semiconductor layer and a second conductivity-type semiconductor layer provided on the active layer, a first electrode conductively contacting the first conductivity-type semiconductor layer, an insulating layer provided on a part of the light emitting structure and the first electrode, and a second electrode conductively contacting the second conductivity-type semiconductor layer, wherein the first electrode may include a first part protruding from the side surface of the first conductivity-type semiconductor layer.

The first conductivity-type semiconductor layer may include a first mesa region and a second mesa region, and the active layer and the second conductivity-type semiconductor layer may be provided on the first mesa region.

The first part of the first electrode may protrude from the side surface of the second mesa region of the first conductivity-type semiconductor layer.

The first electrode may further include a second part provided on the side surface of the second mesa region of the first conductivity-type semiconductor layer.

The first electrode may further include a third part provided on the upper surface of the second mesa region of the first conductivity-type semiconductor layer.

A height of the lower surface of the first part of the first electrode may be the same as a height of the bottom surface of the first conductivity-type semiconductor layer.

In another embodiment disclosed herein, a light emitting device array may include a circuit board, a plurality of light emitting devices provided on the circuit board, each light emitting device including a light emitting structure including a first conductivity-type semiconductor layer, an active layer and a second conductivity-type semiconductor layer, a first electrode conductively contacting the first conductivity-type semiconductor layer, and a second electrode conductively contacting the second conductivity-type semiconductor layer, the first electrode including a first part protruding from the side surface of the first conductivity-type semiconductor layer, an insulating layer provided on a part of the light emitting structure and the first electrode, an insulating resin layer filling a space between the circuit board and the light emitting devices, at least one first electrode line conductively contacting the first electrodes of light emitting devices neighboring to each other in a first direction among the light emitting devices, and at least one second electrode line conductively contacting the second electrodes of light emitting devices neighboring to each other in a second direction intersecting the first direction among the light emitting devices.

The first conductivity-type semiconductor layer of the light emitting device may include a first mesa region and a second mesa region, the active layer and the second conductivity-type semiconductor layer may be provided on the first mesa region, and the first part of the first electrode may protrude from the side surface of the second mesa region of the first conductivity-type semiconductor layer.

The lower surface of the least one first electrode line may contact the upper surface of the first part of the first electrode.

The first electrode may further include a second part provided on the side surface of the second mesa region of the first conductivity-type semiconductor layer, and the at least one electrode line may contact at least a partial region of the second part of the first electrode.

The first electrode may further include a third part provided on the upper surface of the second mesa region of the first conductivity-type semiconductor layer, and a height of the upper surface of the at least one electrode line may be lower than a height of the upper surface of the third part of the first electrode.

The insulating layer may be formed to have a distributed Bragg reflector (DBR) structure.

The insulating layer may include at least one of $SiO_2$, $Si_3N_4$ and a polyimide compound. The first electrode may include an ohmic layer, a reflective layer and a bonding layer. The second electrode may include an ohmic layer and a reflective layer.

A first surface of the at least one first electrode line may contact the insulating layer, and a second surface of the at least one first electrode opposite the first surface may be exposed.

A first surface of the at least one second electrode line may be exposed to the insulating resin layer, and a second surface of the at least one second electrode line opposite the first surface may contact the insulting layer.

The second conductivity-type semiconductor layer may be provided on the first mesa region, the second electrode may be provided on the second conductivity-type semiconductor layer, and a conductive layer may be provided on the second conductivity-type semiconductor layer on the first mesa region.

The at least one electrode line may be inclined by a designated or predetermined angle relative to the first direction.

In another embodiment disclosed herein, a lighting apparatus may include a light emitting device array including a circuit board, a plurality of light emitting devices provided on the circuit board, each light emitting device including a light emitting structure including a first conductivity-type semiconductor layer, an active layer and a second conductivity-type semiconductor layer, a first electrode conductively contacting the first conductivity-type semiconductor layer, and a second electrode conductively contacting the second conductivity-type semiconductor layer, the first electrode including a first part protruding from the side surface of the first conductivity-type semiconductor layer, an insulating layer provided on a part of the light emitting structure and the first electrode, a resin layer filling a space between the circuit board and the light emitting devices and including conductive balls, at least one first electrode line conductively contacting the first electrodes of light emitting devices neighboring to each other in a first direction among the light emitting devices and at least one second electrode line conductively contacting the second electrodes of light emitting devices neighboring to each other in a second direction intersecting the first direction among the light emitting devices, and optical members configured to change a path of light excited by the light emitting device array.

It will be understood that, when each element is referred to as being formed "on" or "under" the other element, it can be directly "on" or "under" the other element or be indirectly formed with one or more intervening elements therebetween. In addition, it will also be understood that "on" or "under" the element may mean the upward direction and the downward direction of the element.

Further, the relational terms "first", "second", "on/above/upper" and "under/below/lower" used in description of the embodiments do not necessarily require or imply physical or logical relations between substances and elements or the order thereof but may be used only to distinguish one substance or element from other substances or elements.

Any reference in this specification to "one embodiment," "an embodiment," "example embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure including a first conductivity-type semiconductor layer, an active layer provided on the first conductivity-type semiconductor layer, and a second conductivity-type semiconductor layer provided on the active layer;
   a first electrode that conductively contacts the first conductivity-type semiconductor layer;
   an insulating layer provided on a portion of the light emitting structure and the first electrode; and
   a second electrode that conductively contacts the second conductivity-type semiconductor layer,
   wherein the first electrode includes a first portion protruding from a side surface of the first conductivity-type semiconductor layer,
   wherein the first electrode and the second electrode are coupled to, respectively, a first electrode line and a second electrode line, and
   wherein the first electrode line and the second electrode line cross each other and are electrically and physically isolated from each other over the first electrode.

2. The light emitting device according to claim 1, wherein the first conductivity-type semiconductor layer includes a first mesa region and a second mesa region, and the active layer and the second conductivity-type semiconductor layer are provided on the first mesa region.

3. The light emitting device according to claim 2, wherein the first portion of the first electrode protrudes from the side surface of the second mesa region of the first conductivity-type semiconductor layer.

4. The light emitting device according to claim 2, wherein the first electrode further includes a second portion provided on the side surface of the second mesa region of the first conductivity-type semiconductor layer.

5. The light emitting device according to claim 2, wherein the first electrode further includes a third portion provided on the upper surface of the second mesa region of the first conductivity-type semiconductor layer.

6. The light emitting device according to claim 1, wherein a height of the lower surface of the first portion of the first electrode is the same as a height of the bottom surface of the first conductivity-type semiconductor layer.

7. A light emitting device according to claim 1, wherein a portion of the insulating layer is provided between the first electrode line and the second electrode line over the first electrode.

8. A light emitting device array comprising:
   a circuit board;
   a plurality of light emitting devices provided on the circuit board, each of the plurality of light emitting devices including a light emitting structure including a first conductivity-type semiconductor layer, an active layer and a second conductivity-type semiconductor layer, a first electrode that conductively contacts the first conductivity-type semiconductor layer, and a second electrode that conductively contacts the second conductivity-type semiconductor layer, the first electrode including a first portion protruding from the side surface of the first conductivity-type semiconductor layer;
   an insulating layer provided on a portion of the light emitting structure and the first electrode;
   an insulating resin layer that fills a space between the circuit board and the plurality of light emitting devices;
   at least one first electrode line that conductively contacts the first electrodes of the plurality of light emitting devices neighboring each other in a first direction among the plurality of light emitting devices; and
   at least one second electrode line that conductively contacts the second electrodes of the plurality of light emitting devices neighboring each other in a second direction intersecting the first direction among the plurality of light emitting devices,
   wherein a lower surface of the least one first electrode line contacts a upper surface of the first portion of the first electrode.

9. The light emitting device array according to claim 8, wherein:
   the first conductivity-type semiconductor layer of the light emitting device includes a first mesa region and a second mesa region, and the active layer and the second conductivity-type semiconductor layer are provided on the first mesa region; and
   the first portion of the first electrode protrudes from the side surface of the second mesa region of the first conductivity-type semiconductor layer.

10. The light emitting device array according to claim 9, wherein:

the first electrode further includes a second portion provided on the side surface of the second mesa region of the first conductivity-type semiconductor layer; and the at least one electrode line contacts at least a partial region of the second portion of the first electrode.

11. The light emitting device array according to claim 9, wherein:

the first electrode further includes a third portion provided on the upper surface of the second mesa region of the first conductivity-type semiconductor layer; and a height of the upper surface of the at least one electrode line is lower than a height of the upper surface of the third portion of the first electrode.

12. The light emitting device array according to claim 8, wherein the insulating layer is formed to have a distributed Bragg reflector (DBR) structure.

13. The light emitting device array according to claim 8, wherein the insulating layer includes at least one of $SiO_2$, $Si_3N_4$, and a polyimide compound.

14. The light emitting device array according to claim 8, wherein the first electrode includes an ohmic layer, a reflective layer, and a bonding layer.

15. The light emitting device array according to claim 8, wherein the second electrode includes an ohmic layer and a reflective layer.

16. The light emitting device array according to claim 8, wherein:

a first surface of the at least one first electrode line contacts the insulating layer; and a second surface of the at least one first electrode opposite the first surface is exposed.

17. The light emitting device array according to claim 8, wherein:

a first surface of the at least one second electrode line is exposed to the insulating resin layer; and a second surface of the at least one second electrode line opposite the first surface contacts the insulting layer.

18. The light emitting device array according to claim 8, wherein:

the second conductivity-type semiconductor layer is provided on the first mesa region;

the second electrode is provided on the second conductivity-type semiconductor layer; and a conductive layer is provided on the second conductivity-type semiconductor layer on the first mesa region.

19. The light emitting device array according to claim 8, wherein the at least one electrode line is inclined by a predetermined angle relative to the first direction.

20. A lighting apparatus comprising:

a light emitting device array including:

a circuit board;

a plurality of light emitting devices provided on the circuit board, each of the plurality of light emitting devices including a light emitting structure including a first conductivity-type semiconductor layer, an active layer and a second conductivity-type semiconductor layer, a first electrode that conductively contacts the first conductivity-type semiconductor layer, and a second electrode that conductively contacts the second conductivity-type semiconductor layer, the first electrode including a first portion protruding from the side surface of the first conductivity-type semiconductor layer;

an insulating layer provided on a portion of the light emitting structure and the first electrode;

a resin layer that fills a space between the circuit board and the light emitting devices and including conductive balls;

at least one first electrode line conductively contacting the first electrodes of the plurality of light emitting devices neighboring each other in a first direction among the plurality of light emitting devices; and at least one second electrode line that conductively contacts the second electrodes of the plurality of light emitting devices neighboring each other in a second direction intersecting the first direction among the plurality of light emitting devices, wherein lower surface of the least one first electrode line contacts a upper surface of the first portion of the first electrode; and optical members configured to change a path of light excited by the light emitting device array.

* * * * *